(12) United States Patent
Chen

(10) Patent No.: US 8,014,122 B2
(45) Date of Patent: Sep. 6, 2011

(54) ELECTROSTATIC GUIDING STRUCTURE WITH METAL OXIDE GENERATED THROUGH ANODIC OXIDATION

(75) Inventor: Yu-Hung Chen, Taipei (TW)

(73) Assignee: Inventec Corporation, Taipei (TW)

( * ) Notice: Subject to any disclaimer, the term of this patent is extended or adjusted under 35 U.S.C. 154(b) by 145 days.

(21) Appl. No.: 12/507,281

(22) Filed: Jul. 22, 2009

(65) Prior Publication Data

US 2010/0020456 A1    Jan. 28, 2010

(30) Foreign Application Priority Data

Jul. 25, 2008    (TW) ................................ 97128458 A

(51) Int. Cl.
*H01H 47/00* (2006.01)
*H05F 3/00* (2006.01)
*H05F 3/02* (2006.01)
*H02H 9/00* (2006.01)

(52) U.S. Cl. .......................................... 361/220; 361/56
(58) Field of Classification Search ................... 361/220
See application file for complete search history.

(56) References Cited

U.S. PATENT DOCUMENTS 6,421,221 B1 * 7/2002 Thomason et al. ............ 361/220
* cited by examiner

*Primary Examiner* — Dharti Patel
(74) *Attorney, Agent, or Firm* — Morris Manning Martin LLP; Tim Tingkang Xia, Esq.

(57) ABSTRACT

An electrostatic guiding structure with metal oxide generated through anodic oxidation includes a metallic case, an oxide layer, a system ground layer, and at least one conductor. The metallic case has an accommodating space, and the system ground layer and the conductor are both located in the accommodating space. The metallic case has an oxide layer formed on a surface thereof after an anode processing. The conductor is electrically connected to the oxide layer on an inner surface of the metallic case and the system ground layer, such that the static electricity is released from the metallic case to the system ground layer.

10 Claims, 5 Drawing Sheets

| Thickness of the oxide layer ($\mu m$) | ESD eliminating test | Leakage current test |
|---|---|---|
| 0 | Y | H |
| 4 | Y | H |
| 6 | Y | L |
| 8 | Y | L |
| 15 | Y | L |
| 25 | Y | L |
| 50 | Y | L |
| 75 | N | L |
| 100 | N | L |

FIG. 9

ELECTROSTATIC GUIDING STRUCTURE WITH METAL OXIDE GENERATED THROUGH ANODIC OXIDATION

CROSS-REFERENCE TO RELATED APPLICATIONS

This non-provisional application claims priority under 35 U.S.C. §119(a) on Patent Application No(s). 097128458 filed in Taiwan, R.O.C. on Jul. 25, 2008 the entire contents of which are hereby incorporated by reference.

BACKGROUND

1. Field of Invention

The present invention relates to an electrostatic discharge structure, and more particularly to an electrostatic guiding structure with metal oxide generated through anodic oxidation.

2. Related Art

Electronic apparatus is mostly in an environment of electrostatic discharge (ESD). An electric field formed by a charged object makes the nearby gas ionize, so as to generate the ESD. The electrostatic interference may damage electronic devices or circuits. Although other electronic devices in the danger of the ESD may not be immediately damaged, the quality of the electronic apparatus is reduced, and the service life of the electronic apparatus is thus shortened.

The voltage generated by the ESD is quite high. When a relative humidity in the environment is lower than 50%, the voltage of the electrostatic charge accumulated on human body may exceed 30,000 V. However, the voltage sustained by most of the electrostatic sensitive devices is mostly lower than 100 V, and some electronic devices may be damaged by a voltage of merely 10 V. Particularly for the electronic apparatus having microelectronic devices, the microelectronic devices are more sensitive to the ESD. The microelectronic devices are mostly formed by stacking extremely tiny structures such as insulating layer, conductive layer, and semiconductive layer, so the instant ESD may damage the inner structures of the microelectronic devices. The microelectronic devices that may be easily damaged by the ESD include, for example, a processor, an application specific integrated circuit (ASICS), and memory devices such as a random access memory (RAM) and a read only memory (ROM).

In addition, the ESD also interferes with the operating environment. The energy delivered or emitted by the ESD may be misrecognized as the valid data by the operating system, which results in a temporary error on the data during the transmission process.

Under the demand of the relative rules of the static electricity, during the manufacturing process, the electronic apparatus and the relative components are usually grounded or electrically connected to a negative voltage to prevent the generation of the static electricity.

Recently, desktop computers, mobile computers, mobile phones, digital audio/video devices, and other consumer electronic apparatus increasingly become popular. Metal color has elegant visual effect, so the electronic apparatus mostly adopt the metallic case as the outer case. Although the ESD effect may be reduced as the metallic case is directly electrically connected to the ground or the negative voltage, when a use contacts with the outer case, the user usually feels an electric shock. This results from leakage current. The leakage current makes the user uncomfortable, and may hurt the human body when it is too high.

SUMMARY

In view of the above problem, the present invention is directed to an electrostatic guiding structure with metal oxide generated through anodic oxidation, thereby solving the problem of electrostatic discharge (ESD) and leakage current in the prior art.

The electrostatic guiding structure with metal oxide generated through anodic oxidation of the present invention is applicable to electronic apparatus. The electrostatic guiding structure with metal oxide generated through anodic oxidation includes a metallic case, an oxide layer, a system ground layer, and at least one conductor.

The system ground layer and the conductor are located in the metallic case. The metallic case has the oxide layer formed on a surface thereof after the anode processing.

The conductor is electrically connected to the oxide layer on an inner surface of the metallic case and the system ground layer, such that the static electricity formed on the metallic case may be discharged to the system ground layer.

A circuit board is accommodated in the metallic case, and at least one electronic device is disposed on the circuit board. The electronic devices are used to execute the functional operation of the electronic apparatus applying an embodiment of the present invention.

Further, a plastic case may be used to isolate various devices (for example, the circuit board and the electronic device) executing the functional operation of the electronic apparatus from the metallic case.

Here, the plastic case is located on one side of the metallic case, that is, accommodated in the metallic case. Another system ground layer is formed on a surface of the plastic case opposite to the metallic case, and the system ground layer may be electrically connected to a ground contact on the circuit board, such that the electronic apparatus may have a system ground with a larger area.

The electrostatic guiding structure with metal oxide generated through anodic oxidation of the present invention is applicable to the electronic apparatus for providing electric power. For example, for a battery component, in an embodiment, the electrostatic guiding structure with metal oxide generated through anodic oxidation includes a plastic case, a metallic case, an oxide layer, and at least one conductor. The battery component has at least one battery cell, and the battery cell is used to provide the electric power.

The plastic case is disposed in the accommodating space of the metallic case, that is, the metallic case is located at an outer side of the plastic case.

The battery cell is disposed at an inner side of the plastic case.

The metallic case has the oxide layer formed on a surface thereof after the anode processing.

The conductor is electrically connected to the oxide layer on the surface of one side of the metallic case near the plastic case, so as to provide an electrical connection between the oxide layer and the system ground of the electronic apparatus.

A first ground pin may be disposed on the battery component. The first ground pin may be corresponding to a second ground pin disposed on the electronic apparatus. The first ground pin is electrically connected to the conductor, and the second ground pin is electrically connected to the system ground of the electronic apparatus.

When the battery component is connected to the electronic apparatus, the first ground pin may contact with the second ground pin to form an electrical conduction, thus forming the electrical connection between the oxide layer and the system ground of the electronic device.

The conductor may be purely implemented by a connection unit (for example, a conducting strip, a wire, and other devices). The connection unit is conductive, and may provide the electrical connection between the system ground (that is, the system ground layer) and the oxide layer on the inner surface of the metallic case.

In addition, the conductor may be implemented by the connection unit and a metal film. The metal film is conductive, and may provide an electrical connection between the oxide layer and the connection unit. The connection unit is conductive, and may provide an electrical connection between the system ground and the metal film. In other words, the system ground and the oxide layer may be electrically conducted through the metal film and the connection unit.

The metal film may be a metal foil such as an aluminum foil and a copper foil, a metal coated film formed by sputtering, evaporation, or other techniques, a conductive cloth, or a conductive foam.

The electrostatic guiding structure with metal oxide generated through anodic oxidation of the present invention includes a plastic case, a metallic case, an oxide layer, and at least one conductor. The surface of the plastic case has a system ground layer. The metallic case is located at the outer side of the plastic case, and the oxide layer is formed on the surface of the metallic case. A thickness of the oxide layer is between approximately 6 μm and approximately 50 μm, and the conductor is electrically connected to the oxide layer and the system ground layer.

Here, the oxide layer may provide a high impedance to restrain the leakage current. The thickness of the oxide layer is preferably between approximately 6 μm and approximately 50 μm.

In addition to effectively eliminating the static electricity by controlling the thickness of the oxide layer, it is possible to control a hole-sealing degree to accelerate the charge conduction, thus being helpful to eliminate the static electricity.

To sum up, the electrostatic guiding structure with metal oxide generated through anodic oxidation of the present invention is applied to effectively eliminate the static electricity formed on the metallic case and to effectively restrain the leakage current on the metallic case.

BRIEF DESCRIPTION OF THE DRAWINGS

The present invention will become more fully understood from the detailed description given herein below for illustration only, and thus are not limitative of the present invention, and wherein:

FIG. 9 shows results of an ESD eliminating test and a leakage current test of the electrostatic guiding structure with metal oxide generated through anodic oxidation according to the present invention.

DETAILED DESCRIPTION OF THE INVENTION

The detailed features and advantages of the present invention are described below in great detail through the following embodiments, the content of the detailed description is sufficient for those skilled in the art to understand the technical content of the present invention and to implement the present invention there accordingly. Based upon the content of the specification, the claims, and the drawings, those skilled in the art can easily understand the relevant objectives and advantages of the present invention.

The technique aims to eliminate static electricity formed on a metallic case. Here, the metallic case is electrically connected to an inner system ground, so as to guide the static electricity on the metallic case to the system ground.

Figure 1:
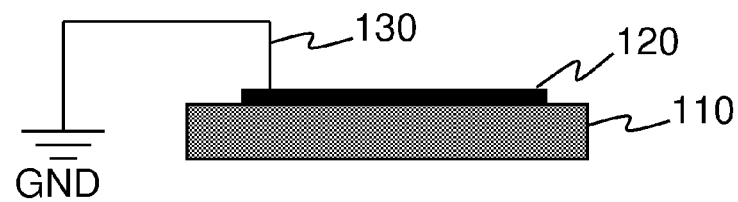
FIG. 1 is a schematic view of an electrostatic guiding structure with metal oxide generated through anodic oxidation according to a first embodiment of the present invention.

Referring to FIG. 1, an electrostatic guiding structure with metal oxide generated through anodic oxidation according to an embodiment of the present invention is shown. The electrostatic guiding structure may be applied to an electronic apparatus or an electronic component.

In this embodiment, the electrostatic guiding structure includes a metal layer 110, an oxide layer 120, and a conductor 130. The metal layer 110 may serve as the metallic case (or metal outer case) of the electronic apparatus or the electronic component.

The oxide layer 120 is formed on a surface of the metal layer 110. The oxide layer 120 is an oxide metal formed on the surface of the metal layer, after the anode processing is performed on the metal layer 110, that is, the anodic oxidation treats on the metal layer 110 to form the oxide metal. For example, if a material of the metal layer 110 is aluminum, after the anode processing is performed on the metal layer 110, an aluminum oxide thin layer formed on the surface of the metal layer 110 is the oxide layer 120.

The metal layer 110 is exposed in the air for a long time, so oxidation or discoloration resulting from humidity, temperature, and other environmental factors easily occurs. Therefore, the anode processing is performed on the metal layer 110 in advance to form the oxide layer 120 on the metal layer 110, thereby preventing the subsequently unnecessary oxidation or discoloration.

Figure 2:
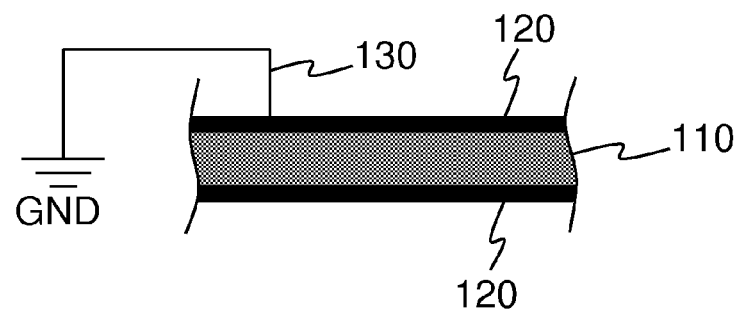
FIG. 2 is a schematic view of the electrostatic guiding structure with metal oxide generated through anodic oxidation according to a second embodiment of the present invention.

Here, the oxide layer 120 may be partially formed on the surface of the metal layer 110. In addition, the oxide layer 120 may also entirely cover the surface of the metal layer 110, as shown in FIG. 2.

The conductor 130 is electrically connected to the metal layer 110 and a system ground GND in the electronic apparatus applying the present invention or a system ground GND relative to the electronic component, such that the static electricity formed on the metallic case (that is, the metal layer 110) may be discharged to the system ground GND.

Further, the oxide layer 120 may provide impedance up to tens of MΩ to hundreds of MΩ, and it may be considered that the inner ground (system ground) and the outer ground (metal layer) are independent to each other, so as to restrain the leakage current. At this time, if the static electricity is forced from one side (hereafter referred to the outer side) of the metal layer 110 onto the metal layer 110, the static electricity reaches the inner part of the metal layer 110 through the oxide layer 120 on the surface of the outer side of the metal layer 110, and then reaches the conductor 130 through the oxide layer 120 on the surface of the other side (hereafter referred to the inner side) of the metal layer 110, so as to be guided to the system ground GND. In this manner, the static electricity on the metallic case (that is, the metal layer 110) may be eliminated.

The contact between the conductor 130 and the oxide layer 120 may be a point contact or a face contact. When the area of the metal layer 110 is relatively large, the electrical connection between the oxide layer 120 and the system ground GND may be provided by two or more conductors 130, so as to effectively guide the static electricity on the metal layer 110 to the system ground GND.

Figure 3:
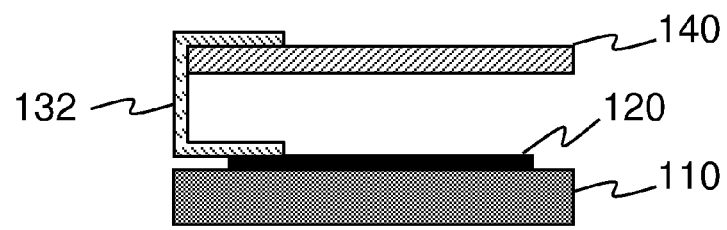
FIG. 3 is a schematic view of the electrostatic guiding structure with metal oxide generated through anodic oxidation according to a third embodiment of the present invention.

Referring to FIG. 3, the conductor 130 includes a connection unit 132, for example, a conducting strip, a wire, and other devices. The connection unit 132 is connected to a system ground layer 140 (that is, the system ground GND) and the oxide layer 120 on the surface of the metal layer 110, in other words, the connection unit 132 contacts with the system ground layer 140 and the oxide layer 120, so as to provide an electrical connection between the system ground layer 140 and the oxide layer 120.

Figure 4:
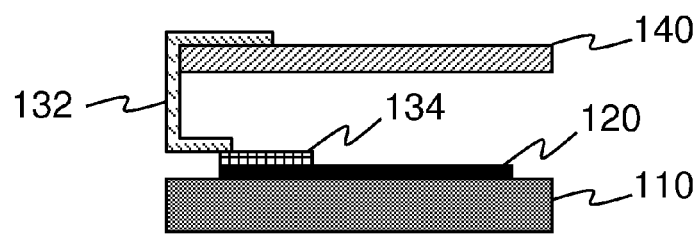
FIG. 4 is a schematic view of the electrostatic guiding structure with metal oxide generated through anodic oxidation according to a fourth embodiment of the present invention.

Referring to FIG. 4, the conductor 130 may further includes a metal film 134. The metal film 134 is located on the oxide layer 120 on the surface of the metal layer 110. That is to say, the metal film 134 is electrically connected to the oxide layer 120.

Here, one end of the connection unit 132 contacts with the metal film 134, and the other end of the connection unit 132 contacts with the system ground layer 140, so as to provide an electrical connection between the system ground layer 140 and the metal film 134. In other words, the system ground layer 140 and the oxide layer 120 are electrically conducted through the metal film 134 and the connection unit 132. The connection unit 132 may be soldered on the metal film 134 and/or the system ground layer 140 though a soldering tin.

Here, the metal film 134 may partially or entirely cover the oxide layer 120 on the inner surface of the metal layer 110. The metal film 134 may be a metal foil such as aluminum foil or copper foil, a metal coated film formed by sputtering, evaporation, or other techniques, a conductive cloth, or a conductive foam.

Figure 5:
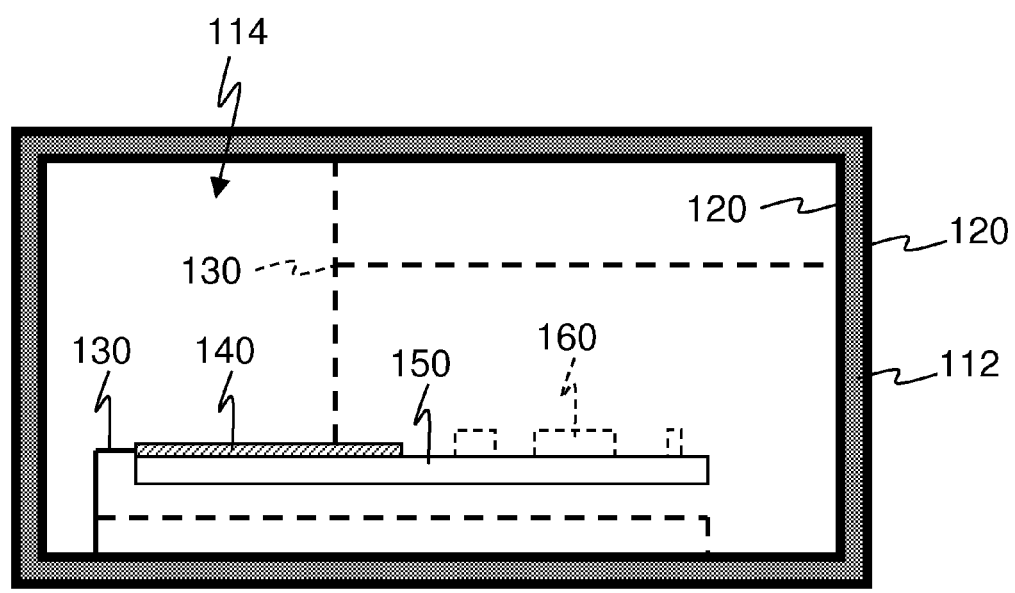
FIG. 5 is a schematic view of the electrostatic guiding structure with metal oxide generated through anodic oxidation according to a fifth embodiment of the present invention.
Figure 6:
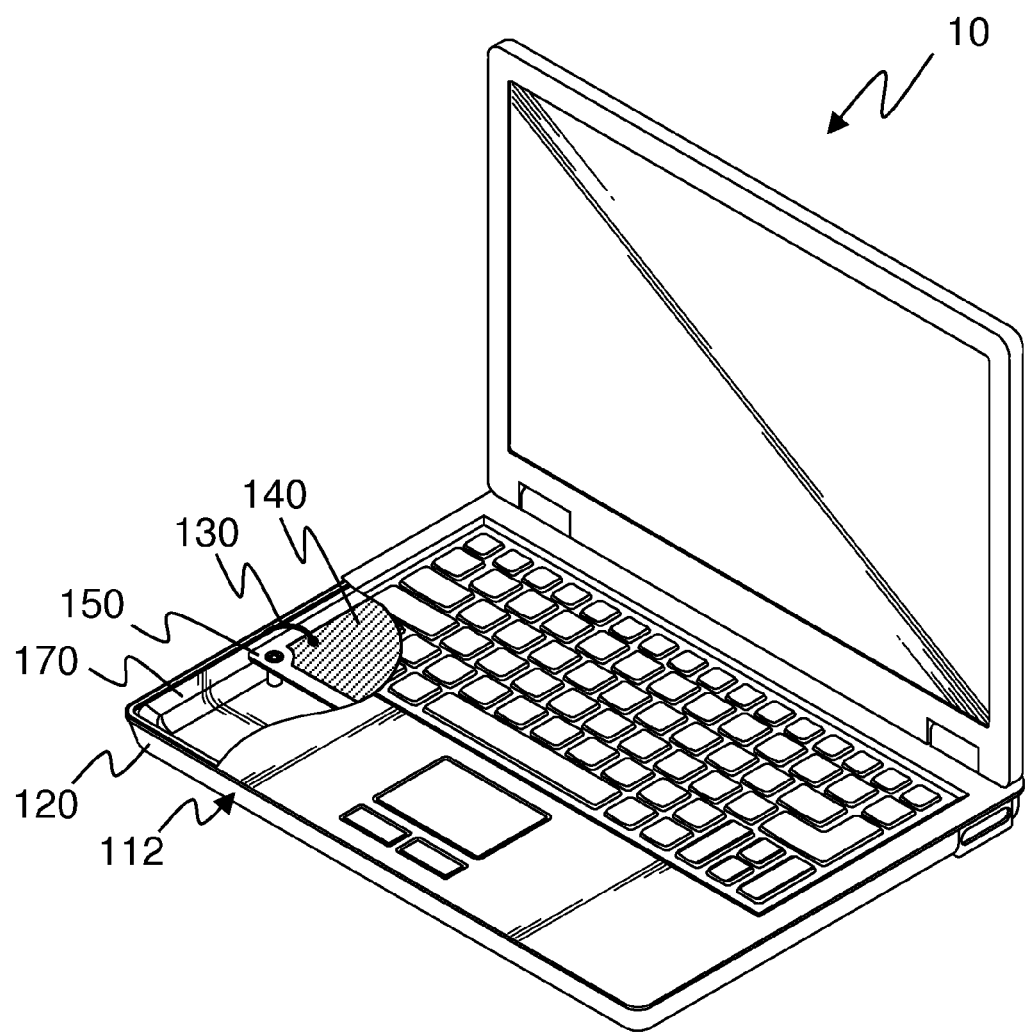
FIG. 6 is a schematic structural view of the electrostatic guiding structure with metal oxide generated through anodic oxidation according to a sixth embodiment of the present invention.

For example, the present invention is applied to the electronic apparatus, referring to FIGS. 5 and 6, the electrostatic guiding structure with metal oxide generated through anodic oxidation according to an embodiment of the present invention is shown. In this embodiment, the electrostatic guiding structure with metal oxide generated through anodic oxidation includes a metallic case 112, an oxide layer 120, a system ground layer 140, and at least one conductor 130.

The metallic case 112 (that is, the metal layer 110) provides an accommodating space 114. The anode processing is performed on the metallic case 112 to form the oxide layer 120 on the surface the metallic case 112. That is, the anodic oxidation treats on the metallic case 112 to form the oxide metal, i.e. the oxide layer 120, thereon.

The system ground layer 140 (that is, the system ground GND) and the conductor 130 are located in the accommodating space 114.

The conductor 130 is electrically connected to the oxide layer 120 on the inner surface of the metallic case 112 and the system ground layer 140. In other words, the conductor 130 is conductive, and contacts with the oxide layer 120 and system ground layer 140.

Here, the conductor 130 may be implemented by the connection unit 132 (referring to FIG. 3 together). The connection unit 132 (that is, the conductor 130) is connected to the system ground layer 140 and the oxide layer 120 on the inner surface of the metallic case 112 (that is, the metal layer 110). In other words, the connection unit 132 is conductive, and contacts with the oxide layer 120 and the system ground layer 140.

In addition, the conductor 130 may be implemented by the connection unit 132 and the metal film 134 (referring to FIG. 4 together). The metal film 134 is located on the oxide layer 120 on the inner surface on the metallic case 112 (that is, the metal layer 110). One end of the connection unit 132 contacts with the metal film 134, and the other end of the connection unit 132 contacts with the system ground layer 140, so as to provide the electrical connection between the system ground layer 140 and the metal film 134. In other words, the metal film 134 provides the electrical connection between the oxide layer and the connection unit 132.

When the electrostatic guiding structure with metal oxide generated through anodic oxidation according to the present invention is applied to the electronic apparatus, the metallic case 112 may be implemented by the metallic case of the electronic apparatus, and the system ground layer 140 may be implemented by the system ground of the electronic apparatus. A circuit board 150 is accommodated in the metallic case 112, and at least one electronic device 160, such as an integrated circuit (IC), a processor, a capacitor, a resistor, a transistor, and other devices, is disposed on the circuit board 150. The electronic devices 160 may be used to execute the functional operation of the electronic device. For example, if the electronic apparatus is a computer 10, the electronic devices 160 may realize the information processing function of the computer 10.

Figure 7:
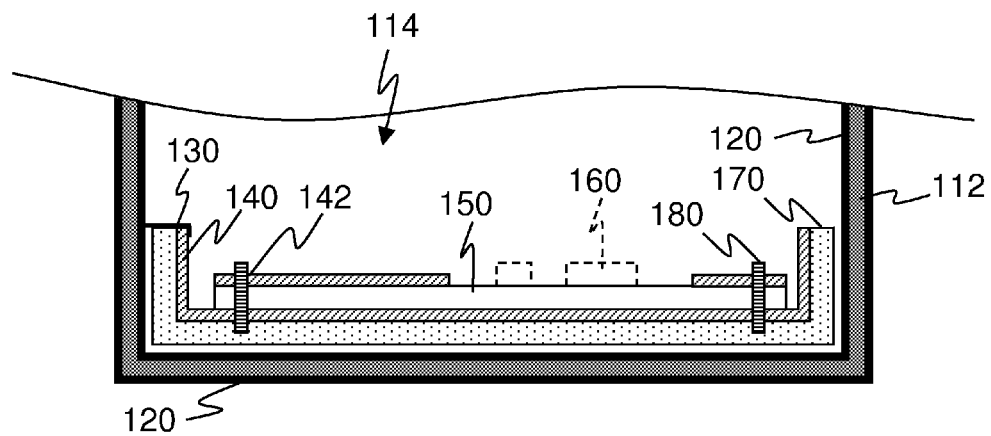
FIG. 7 is a schematic view of the electrostatic guiding structure with metal oxide generated through anodic oxidation according to a seventh embodiment of the present invention.

Referring to FIG. 7, here, a plastic case 170 may be disposed, and the circuit board 150 of the electronic apparatus is disposed in the plastic case 170. In other words, the plastic case 170 may be used to isolate various devices (for example, the circuit board 150 and the electronic device 160) executing the functional operation of the electronic device from the metallic case 112. For example, the plastic case 170 may be disposed on the inner surface of the metallic case 112, and the circuit board 150 is fixed on the surface of the plastic case 170 opposite to the metallic case 112, in which the plastic case 170 may be implemented by the plastic case of the electronic apparatus.

Here, the system ground layer 140 (that is, the system ground GND) may be formed on the surface of the plastic case 170 opposite to the metallic case 112. The conductor 130 is electrically connected to the oxide layer 120 on the inner surface of the metallic case 112, i.e. the surface adjacent to the plastic case 170, and the system ground layer 140 on the surface of the plastic case 170. In other words, the conductor 130 is conductive, and contacts with the oxide layer 120 and the system ground layer 140.

In addition, a ground contact 142 on the surface of the circuit board 150 may be electrically connected to the system ground layer 140 on the surface of the plastic case 170, such that the electronic apparatus has the system ground with a larger area. The electrical connection between the ground contact 142 on the surface of the circuit board 150 and the system ground layer 140 on the surface of the plastic case 170 may be realized by a conductive locking member 180, and at the same time, the circuit board 150 may be fixed on the plastic case 170. For example, the locking member 180 may be a metal screw penetrating the circuit board 150 and locked on the plastic case 170 having the system ground layer 140 disposed on the surface.

The metallic case 112 may be a case structure forming a closed accommodating space or a case structure forming an open accommodating space. The plastic case 170 may be a case structure forming a closed accommodating space or a case structure forming an open accommodating space.

Figure 8:
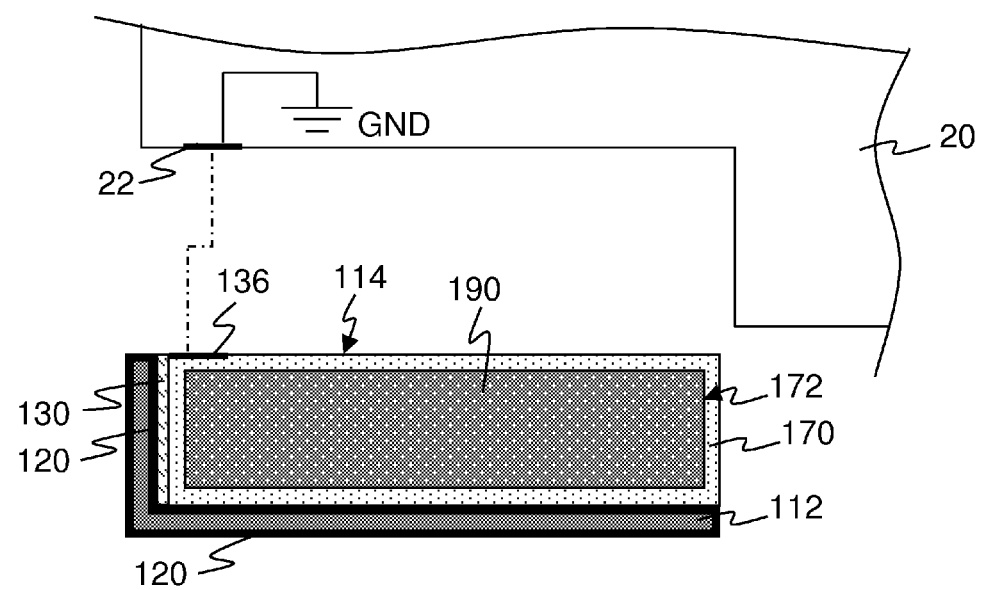
FIG. 8 is a schematic view of the electrostatic guiding structure with metal oxide generated through anodic oxidation according to an eighth embodiment of the present invention.

For example, the present invention is applied to a battery component, referring to FIG. 8, the electrostatic guiding structure with metal oxide generated through anodic oxidation according to an embodiment of the present invention is shown. The electrostatic guiding structure with metal oxide generated through anodic oxidation is applicable to a battery component. The battery component has at least one battery cell 190 for providing electric power to the electronic apparatus 20. In this embodiment, the electrostatic guiding structure with metal oxide generated through anodic oxidation includes a metallic case 112, an oxide layer 120, at least one conductor 130, and a plastic case 170.

The metallic case 112 has an open accommodating space 114. The plastic case 170 is disposed at the inner side of the metallic case 112, that is, disposed inside the accommodating space 114. The plastic case 170 also has an accommodating space 172, for accommodating functional devices, for example, the battery cell 190, executing the functional operation of the battery component.

The battery cell 190 is disposed at the inner side of the plastic case 170, that is, disposed inside the accommodating space 172. The battery cell 190 is used to execute the functional operation of the electrostatic guiding structure with metal oxide generated through anodic oxidation. In other words, the battery cell 190 stores the electric power, and when the battery component is connected to the electronic apparatus 20 (that is, the battery component is installed on the electronic apparatus 20), the electric power stored in the battery cell 190 may be provided to the electronic apparatus 20 through the electrical connection position between the battery component and the electronic apparatus 20.

After the anode processing is performed on the metallic case 112, the oxide layer 120 is formed on the surface. The metallic case 112 and the plastic case 170 may be isolated from each other through the oxide layer 120.

The conductor 130 is electrically connected to the oxide layer 120 on the surface at one side of the metallic case 112 near the plastic case 170. Here, the conductor 130 may be partially sandwiched between the metallic case 112 and the plastic case 170.

When the battery component is connected to the electronic apparatus 20, the conductor 130 may electrically connect the oxide layer 120 on the surface of the metallic case 112 to the system ground GND of the electronic apparatus 20. In other words, the conductor 130 may provide the electrical connection between the oxide layer 120 and the system ground GND of the electronic apparatus 20.

A first ground pin 136 may be disposed on the battery component. The first ground pin 136 may be corresponding to a second ground pin 22 disposed on the electronic apparatus 20.

The first ground pin 136 is electrically connected to the conductor 130. The second ground pin 22 is electrically connected to the system ground GND of the electronic apparatus 20.

When the battery component is connected to the electronic apparatus 20, the first ground pin 136 contacts with the second ground pin 22 to be electrically conducted, so as to form the electrical connection between the oxide layer 120 and the system ground GND of the electronic apparatus 20.

Here, an ESD eliminating test and a leakage current test are performed by using the oxide layers 120 with different thicknesses, and the results are as shown in FIG. 9. Here, the test is performed by using an ESD of 15 KV. The oxide layers with thicknesses of approximately 0 μm, 4 82 m, 6 μm, 8 μm, 15 μm, 25 μm, 50 μm, 75 μm, and 100 μm are respectively formed by using the anode processing.

During the ESD eliminating test, the ESD (Y) is effectively eliminated when the thickness of the oxide layer is within approximately 50 μm, and the ESD (N) is hardly eliminated when the thickness of the oxide layer is larger than approximately 50 μm (for example, approximately 75 μm and approximately 100 μm).

The larger thickness of the oxide layer results in more difficulties in the charge conduction, such that it is impossible to effectively eliminate the static electricity. If it intends to achieve the electrostatic eliminating effect, a certain degree of electrostatic charges must be accumulated to provide larger energy to conduct the charge to pass through the oxide layer. For example, when tens of ESD or the ESD with higher KV value (for example, 25 KV or 35 KV) is applied on the oxide layer with the thickness larger than 50 μm, similarly the discharge occurs. However, in the regulation, the test is performed until 8 KV, and the test until 15 KV is required on some specific electronic instrument such as the notebook computer.

However, the surface impedance generated on the oxide layer after being specially processed may affect the electrostatic eliminating effect. For example, when the impedance of the oxide layer is low, due to the small impedance of the oxide layer when the static electricity is forced on the surface, the moving speed of electrons and holes is quicker, such that the energy may quickly enter the ground of the apparatus, thereby resulting in digital signal interference and affecting the normal operation of the electronic apparatus. In other words, under this situation, the electrostatic may result in the interference or damage on the apparatus. However, when the impedance of the oxide layer is high, due to the large impedance of the oxide layer, when the static electricity is forced on the surface, the moving speed of the electrons and holes is slower, thereby resulting in energy cost. Next, when the electrostatic energy passes through the oxide layer of the other end, due to the large surface impedance, the electrons and holes move slowly, so as to reduce the energy directly entering the ground of the device in a large quantity to interfere with the digital signal, thereby achieving the electrostatic eliminating effect.

In addition, the experiment is performed under a hole-sealing degree of 100%. However, with the appropriate hole-sealing process, it is possible to effectively improve the charge conduction speed. For example, the reducing of the hole-sealing degree is helpful to improve the charge conduction speed, thereby accelerating the electrostatic elimination. Therefore, in addition to effectively eliminating the electrostatic by controlling the thickness of the oxide layer, the hole-sealing degree may be controlled to accelerate the charge conduction, thus being helpful to eliminate the static electricity.

Further, when the oxide layer is too thin (for example, smaller than approximately 6 μm), although the static electricity may be eliminated, the surface impedance of the oxide layer is reduced accordingly. According to the Ohm's law V=IR (voltage is equal to a product of current and impedance), under the same voltage, the reducing of the surface impedance of the oxide layer may result in the increasing of the current flowing through the oxide layer. However, when a large quantity of energy is instantly guided to the ground, the ground potential may jump, such that a reference ground potential of the electronic signal cannot be interpreted, and even the machine failure risk is generated. At this time, the electrostatic eliminating effect identical to that of the oxide layer with the thickness larger than 6 μm may be achieved with the anode processing hole-sealing, thereby preventing the static electricity from damaging the surrounding or hurting the human body.

During the anode processing hole-sealing process, the hole-sealing degree determines the charge conduction capability in the oxide layer. In another experiment, during the anode processing process, an electrostatic eliminating manner by using the oxide layer with a thickness smaller than 6 μm is formed, and the hole-sealing processing is performed. It is approved by the experiment that when the hole-sealing degree is within 50%±20%, and the thickness of the oxide layer is between approximately 4 μm and 6 μm, the static electricity may be effectively eliminated without damaging the surrounding or hurting the human body.

Here, the control of the thickness of the film of the oxide layer and the hole-sealing degree may be adjusted and matched according to regulations and demands of different fields. The application fields may cover applications of various industries, such as aeronautics and astronautics, military industry, or electronic mechanical industry. That is to say, the thickness of the film of the oxide layer and the hole-sealing degree may have different effective using scopes according to the electrostatic eliminating effects required by relative rules, regulations, or specification of the applied fields.

In the test of the leakage current from the system end (electronic apparatus), when the thickness of the oxide layer is approximately 15 μm, the measured voltages are all lower than 10-20 mV (L), and when the thickness of the oxide layer is approximately 4 μm, the measured voltages are all higher than 20 mV (H). To sum up, the electronic device and the battery component applying the electrostatic guiding structure with metal oxide generated through anodic oxidation according to the present invention may effectively eliminate the static electricity formed on the metallic case, and may effectively restrain the leakage current on the metallic case.

What is claimed is:

1. An electrostatic guiding structure with metal oxide generated through anodic oxidation, applicable to a battery component, wherein the battery component has at least one battery cell, and the battery cell is used to provide electric power to an electronic apparatus, the electrostatic guiding structure comprising:
    a plastic case, for accommodating the battery cell;
    a metallic case, located at an outer side of the plastic case;
    an oxide layer, formed on a surface of the metallic case; and
    at least one conductor, electrically connected to the oxide layer on the surface of metallic case near the plastic case, for providing an electrical connection between the oxide layer and a system ground of the electronic apparatus.

2. The electrostatic guiding structure with metal oxide generated through anodic oxidation according to claim 1, wherein the conductor comprises:
    at least one connection unit, connected to the oxide layer, for providing the electrical connection between the oxide layer and the system ground of the electronic apparatus.

3. The electrostatic guiding structure with metal oxide generated through anodic oxidation according to claim 1, wherein the conductor comprises:
    at least one metal film, located on the oxide layer on the inner surface of the metallic case, for electrically connecting to the oxide layer; and
    at least one connection unit, connected to the metal film, for providing an electrical connection between the metal film and the system ground of the electronic apparatus.

4. The electrostatic guiding structure with metal oxide generated through anodic oxidation according to claim 1, further comprising:
    a first ground pin, corresponding to a second ground pin of the electronic apparatus, and connected to the conductor, wherein the second ground pin is electrically connected to the system ground of the electric apparatus, when the battery component is installed on the electronic apparatus, the first ground pin contacts with the second ground pin, so as to form the electrical connection between the oxide layer and the system ground of the electronic apparatus.

5. The electrostatic guiding structure with metal oxide generated through anodic oxidation according to claim 1, wherein a thickness of the oxide layer is between approximately 6 μm and approximately 50 μm.

6. A battery component, applicable to an electronic apparatus, the battery component comprising:
    at least one battery cell; and
    an electrostatic guiding structure with metal oxide generated through anodic oxidation, comprising:
    a plastic case, accommodated the battery cell;
    a metallic case, located at an outer side of the plastic case;
    an oxide layer, formed on a surface of the metallic case; and
    at least one conductor, electrically connected to the oxide layer on the surface of metallic case near the plastic case, for providing an electrical connection between the oxide layer and a system ground of the electronic apparatus.

7. The battery component according to claim 6, wherein the conductor comprises:
    at least one connection unit, connected to the oxide layer, for providing the electrical connection between the oxide layer and the system ground of the electronic apparatus.

8. The battery component according to claim 6, wherein the conductor comprises:
    at least one metal film, located on the oxide layer on the inner surface of the metallic case, for electrically connecting to the oxide layer; and
    at least one connection unit, connected to the metal film, for providing an electrical connection between the metal film and the system ground of the electronic apparatus.

9. The battery component according to claim 6, wherein the electrostatic guiding structure further comprising:
    a first ground pin, corresponding to a second ground pin of the electronic apparatus, and connected to the conductor, wherein the second ground pin is electrically connected to the system ground of the electric apparatus, when the battery component is installed on the electronic apparatus, the first ground pin contacts with the second ground pin, so as to form the electrical connection between the oxide layer and the system ground of the electronic apparatus.

10. The battery component according to claim 6, wherein a thickness of the oxide layer is between approximately 6 μm and approximately 50 μm.

* * * * *